United States Patent [19]
De Samber et al.

[11] Patent Number: 6,125,026
[45] Date of Patent: Sep. 26, 2000

[54] ELECTRIC COMPONENT WHICH CAN BE MOUNTED ON THE SURFACE OF A PRINTED CIRCUIT BOARD AS WELL AS A METHOD OF MANUFACTURING SUCH COMPONENTS

[75] Inventors: Mark A. De Samber; Gerjan F. A. Van De Walle, both of Eindhoven, Netherlands

[73] Assignee: U.S. Philips Corporation, New York, N.Y.

[21] Appl. No.: 09/343,908

[22] Filed: Jun. 30, 1999

Related U.S. Application Data

[62] Division of application No. 08/924,931, Sep. 8, 1997, Pat. No. 5,948,233.

[30] Foreign Application Priority Data

Sep. 9, 1996 [EP] European Pat. Off. .............. 96202506

[51] Int. Cl.[7] ................................ H01G 4/30; H05K 7/02
[52] U.S. Cl. ........................ 361/301.4; 361/303; 361/305; 361/760; 174/260
[58] Field of Search ................................ 361/301.4, 303, 361/305, 306.1, 306.3, 309, 310, 321.1, 321.2, 321.3, 766, 782, 760; 174/260; 29/840, 846

[56] References Cited

U.S. PATENT DOCUMENTS

| | | | |
|---|---|---|---|
| 4,097,986 | 7/1978 | Henry et al. | 29/583 |
| 4,984,130 | 1/1991 | Dull et al. | 361/321.1 |
| 5,053,916 | 10/1991 | Weekamp et al. | 361/308.1 |
| 5,656,547 | 8/1997 | Richards et al. | 438/460 |
| 5,683,566 | 11/1997 | Hetzler | 205/122 |
| 5,858,815 | 1/1999 | Heo et al. | 438/112 |

*Primary Examiner*—Kristine Kincaid
*Assistant Examiner*—Anthony Dinkins
*Attorney, Agent, or Firm*—Norman N. Spain

[57] ABSTRACT

The invention relates to an electric component (surface mountable component) which can be mounted on the surface of a printed circuit board. Such a component includes a thin, electroconductive layer or stack of layers which is provided with end contacts and arranged on a support of an electrically insulating material. In accordance with the invention, the dimension of the layer or stack of layers in at least one direction parallel to the surface of the support is smaller than the dimension of the support in the direction, while leaving portions of the surface of the support clear on at least two sides of the layer or stack of layers, and end contacts for the layer or stack of layers are situated on the surface portions of the support which are free of this layer or stack of layers, the thickness of the end contacts being larger than the thickness of the layer or stack of layers.

3 Claims, 3 Drawing Sheets

ELECTRIC COMPONENT WHICH CAN BE MOUNTED ON THE SURFACE OF A PRINTED CIRCUIT BOARD AS WELL AS A METHOD OF MANUFACTURING SUCH COMPONENTS

RELATED APPLICATIONS

This is a divisional of Application Ser. No. 08/924,931, filed Sep. 8, 1997 now U.S. Pat. No. 5,948,233.

Electric component which can be mounted on the surface of a printed circuit board as well as a method of manufacturing such components.

The invention relates to an electric component (surface mountable component) which can be mounted on the surface of a printed circuit board, which surface mountable component comprises a thin electroconductive layer or stack of layers which is provided with end contacts and arranged on a substrate of an electrically insulating material.

The invention also relates to a method of manufacturing surface mountable components which can be mounted on the surface of a printed circuit board, in which method a number of electroconductive layers or stacks of layers are provided on a supporting plate, whereafter the components are obtained by subdividing said substrate plate.

Said components may be, for example, passive components, such as resistors, capacitors and coils or active components as well as combinations of passive and/or active components. Such components comprise a support, for example, of glass, silicon, aluminium oxide or other materials which are suitable for this purpose. Resistors and coils comprise at least one thin electroconductive layer. Capacitors, however, comprise at least two electroconductive electrode layers which are separated from each other by a dielectric layer of an electrically insulating material. Besides, the electric components in accordance with the invention can also be constructed so as to form multilayer components. In this case, said components comprise more electroconductive layers, for example five or more.

Components of the type mentioned in the opening paragraph as well as methods of manufacturing such components are widely known. The components can be obtained, for example, by providing, in accordance with a pattern formed by means of a mask, a large number of suitable electroconductive layers or stacks of layers from the vapor phase or by means of electroless or electroplating techniques onto a relatively large substrate plate. This substrate plate is subsequently subdivided into a large number of electric components which are subsequently provided with side contacts.

SUMMARY OF THE INVENTION

The provision of side contacts, however, may be problematic in the case of components having small dimensions and comprising one layer or various thin layers having a thickness of the order of one micrometer or less. If use is made of the customary techniques there is a risk, for example, that not all eligible layers of a stack do electrically contact the side contacts. If the dimensions of the layer are very small, it may sometimes even be very difficult to provide reliable side contacts by means of the known techniques. It is an object of the invention to avoid such problems.

Components which do not exhibit these problems, or to a much smaller degree, are characterized in accordance with the invention, in that the dimension of the layer or stack of layers in at least one direction parallel to the surface of the support is smaller than the dimension of the support in said direction, while leaving portions of the surface of the support clear on at least two sides of the layer or stack of layers, and in that metallic end contacts for the layer or stack of layers are situated on the surface portions of the support which are free of said layer or stack of layers, the thickness of said end contacts being larger than the thickness of the layer or stack of layers. The thickness of the end contacts is preferably at least 1.2 times, and more preferably at least 1.5 times, the thickness of the layer or stack of layers.

Using the metallic end contacts, components in accordance with the invention can be mounted directly onto a substrate provided with a conductor pattern. The components are mounted, preferably by soldering, onto the conductor pattern in such a manner that the layer of stack of layers faces said conductor pattern. For this reason, a preferred embodiment of the electric components in accordance with the invention is characterized in that the end contacts consist predominantly of a layer of a solder metal, preferably lead-tin solder or gold-tin solder.

If the components additionally comprise side contacts, said components can also be mounted, preferably also by soldering, onto the conductor pattern in such a manner that the free surface of the support faces the conductor pattern.

In both embodiments, the end contacts, whose thickness is larger than that of the layer or the stack of layers on the support, ensure that a substantially infallible electric contact is made with the layer or the eligible electroconductive layers of the stack.

A method of manufacturing electric components in accordance with the invention is characterized according to the invention in that the clear surface of the substrate plate, which surface is situated between adjacent layers or stacks of layers, is provided with patterned intermediate layers which are predominantly made of a metal, the thickness of the intermediate layer being larger than the thickness of the layers or the stack of layers, whereafter the substrate plate is subdivided so that the metallic intermediate layers are subdivided at the same time, thereby forming components whose end contacts consist of the metal of the intermediate layers.

The metallic intermediate layers can be provided in any suitable, known manner, for example by spraying, screen printing or by means of a solder jet and such. Preferably, these intermediate layers consist predominantly of a solder metal, such as, preferably, alloys of lead-tin and gold-tin.

In accordance with a preferred embodiment of the method according to the invention, end contacts of a solder metal are provided by electrodeposition. Consequently, this embodiment is characterized in that after the layers or stacks of layers have been provided on the substrate plate in accordance with a pattern, a continuous electroconductive auxiliary layer and a masking layer are successively provided, with surface portions of the support with the auxiliary layer which are situated between layer portions or stacks of layers being left clear by the masking layer, and, subsequently, an intermediate layer of a solder metal being electrodeposited in the spaces left clear by the masking layer, said masking layer and the portions of the auxiliary layer which are not covered with solder metal subsequently being removed.

In the last-mentioned embodiment, the thickness of the masking layer is preferably at least equal to the intended thickness of the solder-metal layer and larger than the thickness of the layer or stack of layers, which are to be provided with end contacts of a solder metal. A suitable masking layer can be provided, for example, by screen printing or a photolithographic process using a suitable photoresist. The masking layer leaves the substrate plate carrying an electroconductive layer clear at locations where parts of the layer or stacks of layers are to be provided with end contacts.

The electroconductive auxiliary layer which serves as an electrode during the electrodeposition process may comprise a number of sub-layers. A favorable auxiliary layer comprises, for example, a first sub-layer, for example, of titanium-tungsten and a second sub-layer of copper, which sub-layers are provided by sputtering. In this case, the first sub-layer serves as an anti-diffusion layer and the second sub-layer serves as a good electric conductor. The latter sub-layer may also be used as a nucleating layer for the electrodeposition of the solder metal, for example an alloy of lead-tin or gold-tin.

After electrodeposition of the solder metal, the (composite) auxiliary layer, which has served as an electrode for the electrodeposition, and the masking material are removed by means which do not attack the solder metal, such as selective etchants and solvents. Subsequently, the substrate plate is subdivided into individual electric components, which are provided with end contacts. This subdivision takes place, for example, by breaking, sawing, punching, laser cutting and such.

If necessary, side contacts can be obtained by providing the side faces of individual components having end contacts with a metal layer, such as palladium or nickel by sputtering or another technique, whereafter a solder metal is grown on said metal layer in an electroless or electrochemical process. The presence of end contacts of a solder metal enables the side contacts to be provided very easily and with a higher yield.

These and other objects of the invention will be apparent from and elucidated with reference to the embodiments described hereinafter.

DETAILED DESCRIPTION OF THE INVENTION

Figure 1A:
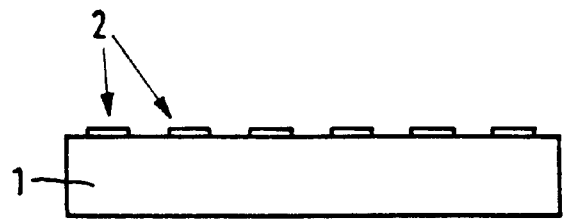
FIGS. 1A to 1H schematically show different stages of an embodiment of the method in accordance with the invention.
Figure 1B:
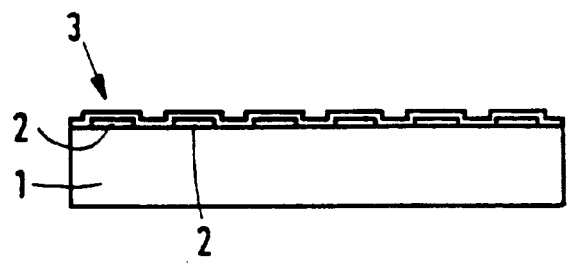
Figure 1C:
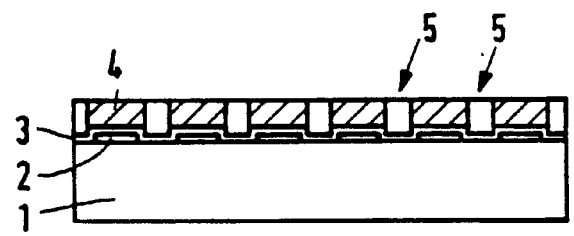
Figure 1D:
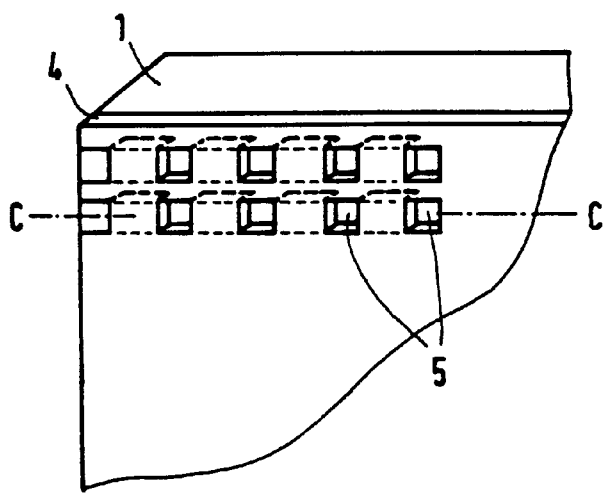
Figure 1E:
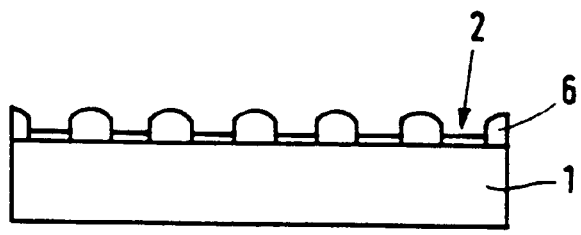
Figure 1F:
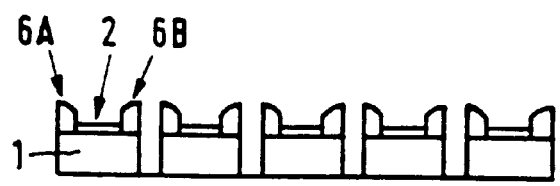
Figure 1G:
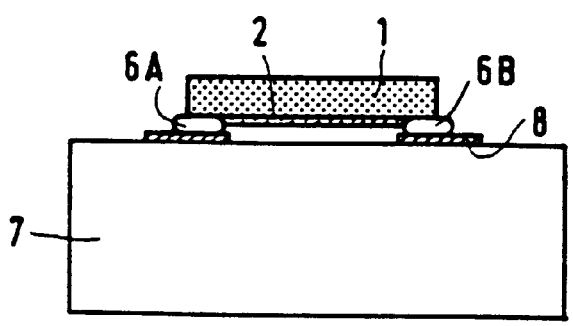
Figure 1H:
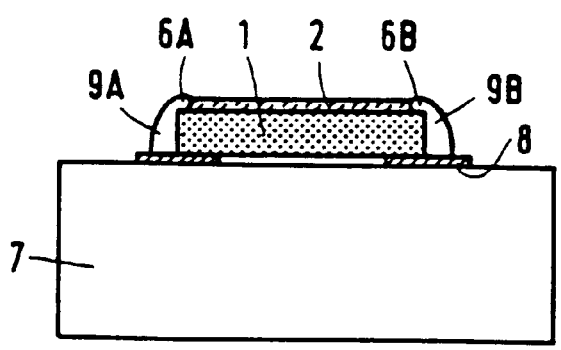

The invention will now be described in greater detail with reference to the figures of the drawing.

In the method in accordance with the invention use is made of a substrate plate 1, a schematic, sectional view of which is shown in FIG. 1-A, and which carries a number of layers or stacks of layers 2, which are provided on the substrate plate in a manner which is known per se. Using the method in accordance with the invention, the layers or stacks of layers are provided with end contacts. In accordance with a preferred embodiment of the method in accordance with the invention, this is achieved by providing the surface of the substrate plate 1 carrying the layers 2, for example, of a resistance material, with, in succession, an electroconductive auxiliary layer 3 and a masking layer 4. As schematically shown in FIG. 1-B, the auxiliary layer 3 covers the entire surface of the substrate plate 1. Using a photoresist, the masking layer 4 is provided in accordance with such a pattern that spaces between the adjacent layers 2 are left clear. This is shown in section in FIG. 1-C.

FIG. 1-D is a perspective view of a part of a substrate plate 1 carrying two rows of separate layers 2, as shown in FIG. 1-C, which are indicated by interrupted lines. Said layers are first provided with a thin auxiliary layer 3, as shown in FIG. 1-C, for example, of sputtered tungsten-titanate and copper. This auxiliary layer, which comprises two sub-layers, serves as a combined anti-diffusion layer/short-circuit layer/nucleation layer. Subsequently, said auxiliary layer is provided with a thick layer of a photoresist 4 which, after it has been developed, leaves clear parts 5 of the underlying substrate plate carrying the auxiliary layer. An intermediate layer of a solder metal 6, preferably PbSn, is electrochemically deposited in apertures 5 which are left clear by the mask of photoresist 4 and on the bottom of which there is a non-masked part of the electroconductive auxiliary layer 3. FIG. 1-E is a schematic, sectional view of the result obtained after selectively etching and dissolving the electroconductive auxiliary layer 3 and the masking layer 4.

Subsequently, the substrate plate 1 is subdivided into a number of supports which each carry one layer 2 and which are each provided with two end contacts. In this case, the substrate plate is subdivided by sawing. In this process, also the intermediate layer of a solder metal 6 is subdivided, thereby forming end contacts 6A and 6B at the components. FIG. 1-F is a schematic, sectional view of this situation, in which a number of these components are shown in side view. The thickness of the solder-metal layer 6 may range, for example, from 10 to 100 $\mu$m, however, if necessary a larger thickness may be chosen.

Starting from the electric components provided with end contacts, as shown in FIG. 1-F, there are, in principle, two ways of treating these components. As shown in FIG. 1-G, the component can be mounted directly, for example by soldering, onto a printed circuit board 7 having a conductor pattern 8.

However as shown in FIG. 1-H, the components according to FIG. 1-F, may alternatively be provided first with side contacts 9A and 9B in accordance with a technique which is known per se. This method has the advantage that, by virtue of the thick solder-metal layer 6, a side contact can be made much more easily and with a much higher yield. In addition, it has been found that the growing of a solderable side contact on an already present, thick solder-metal layer is very simple.

Figure 2:
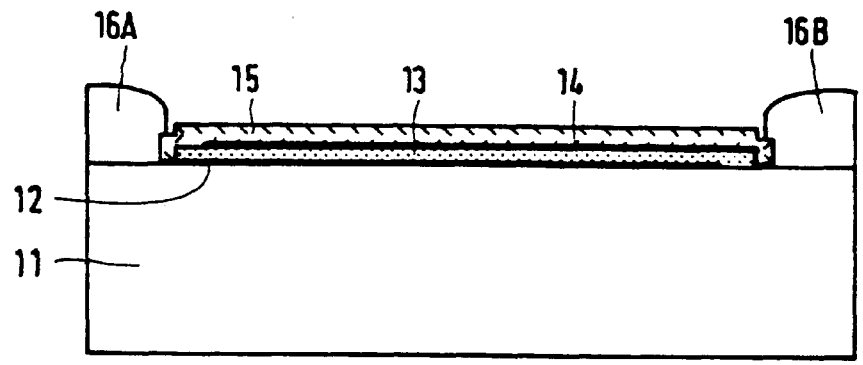
FIG. 2 is a schematic, sectional view of a thin-film capacitor in accordance with the invention.

FIG. 2 is a schematic, sectional view of a thin-film capacitor in accordance with the invention. A support II of an electrically insulating material, for example a ceramic material such as $Al_2O_3$, is provided with a first layer of aluminum 12, for example, by vapor deposition. Subsequently, a layer of an electrically insulating material 13, for example silicon nitride, and a second aluminum layer 14 are provided. The assembly is covered with an electrically insulating protective coating 15, for example, of polyimide. After solder-metal layers 16A and 16B have been provided in the manner described hereinbefore and illustrated in FIGS. 1-A to 1-H a structure in which a capacitor is situated on a support is obtained by subdividing the substate plate carrying a number of identical capacitors in a sawing process, in which the solder-metal layers between the stacks of layers are also sawn through, thereby forming the end contacts 16A and 16B.

Figure 3:
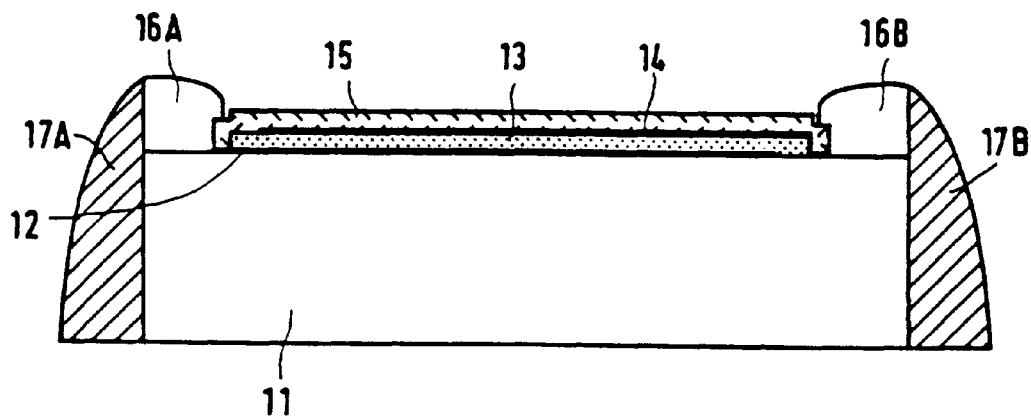
FIG. 3 is a schematic, sectional view of another capacitor in accordance with the invention, which is provided with side contacts.

Finally, FIG. 3 shows such a capacitor which is provided in known manner with side contacts 17A and 17B.

The present invention provides a simple method of manufacturing small-size electric components in which the end contacts form a reliable electric connection with the ekectriconductive layer or stack of layers of the component.

What is claimed is:

1. An electric component which is mountable on the surface of a printed circuit board, which surface mountable component comprises a thin electroconductive layer or stack of layers which is provided with end contacts and arranged on a support of an electrically insulating material, characterized in that the dimension of the layer or stack of layers in at least one direction parallel to the surface of the support is smaller than the dimension of the support in said direction, while leaving portions of the surface of the support clear on at least two sides of the layer or stack of layers, and in that metallic end contacts for the layer or stack of layers are situated on the surface portions of the support which are free of said layer or stack of layers, the thickness of said end contacts being larger than the thickness of the layer or stack of layers.

2. An electric component as claimed in claim 1, characterized in that the end contacts consist predominantly of a layer of a solder metal.

3. An electric component as claimed in claim 2, characterized in that the component also comprises side contacts which electrically contact the end contacts.

* * * * *